(12) United States Patent
Hezler et al.

(10) Patent No.: US 11,955,315 B2
(45) Date of Patent: Apr. 9, 2024

(54) WORKPIECE PROCESSING APPARATUS WITH PLASMA AND THERMAL PROCESSING SYSTEMS

(71) Applicants: Beijing E-Town Semiconductor Technology Co., Ltd., Bejing (CN); Mattson Technology, Inc., Fremont, CA (US)

(72) Inventors: Dieter Hezler, Lonsee-Halzhausen (DE); Keli Huang, Wuhan (CN); Jianmin Ji, Beijing (CN); Deqiang Zeng, Shanghai (CN); Manuel Sohn, Neu-Ulm (DE)

(73) Assignees: Beijing E-Town Semiconductor Technology Co., Ltd., Beijing (CN); Mattson Technology, Inc., Fremont, CA (US)

( * ) Notice: Subject to any disclaimer, the term of this patent is extended or adjusted under 35 U.S.C. 154(b) by 360 days.

(21) Appl. No.: 17/238,597

(22) Filed: Apr. 23, 2021

(65) Prior Publication Data
US 2022/0189737 A1      Jun. 16, 2022

(30) Foreign Application Priority Data

Dec. 14, 2020   (CN) .......................... 202011464609.6

(51) Int. Cl.
*H01J 37/32*     (2006.01)
*H01J 37/18*     (2006.01)

(52) U.S. Cl.
CPC ......... *H01J 37/32119* (2013.01); *H01J 37/18* (2013.01); *H01J 37/32449* (2013.01);
(Continued)

(58) Field of Classification Search
CPC ................ H01J 37/32119; H01J 37/18; H01J 37/32449; H01J 37/32651; H01J 37/32724; H01J 2237/20214; H01J 37/32431; H01J 37/32715; H01J 37/321; H01J 37/32522; H01J 2237/3321; H01L 21/67115; H01L 21/68792
See application file for complete search history.

(56) References Cited

U.S. PATENT DOCUMENTS 6,308,654 B1 * 10/2001 Schneider ............. H01J 37/321
156/345.43
6,503,562 B1    1/2003 Saito et al.
(Continued)

FOREIGN PATENT DOCUMENTS

JP          2002155364          5/2002

*Primary Examiner* — Renan Luque
(74) *Attorney, Agent, or Firm* — Dority & Manning, P.A.

(57) ABSTRACT

A processing apparatus for processing a workpiece is presented. The processing apparatus includes a processing chamber, a plasma chamber separated from the processing chamber disposed on a first side of the processing chamber, and a plasma source configured to generate a plasma in the plasma chamber. One or more radiative heat sources configured to heat the workpiece disposed on a second and opposite side of the first side of the processing chamber. A dielectric window is disposed between the workpiece support and the one or more heat sources. The processing apparatus includes a rotation system configured to rotate the workpiece, the rotation system comprising a magnetic actuator.

20 Claims, 16 Drawing Sheets

(52) U.S. Cl.
　　CPC .. *H01J 37/32651* (2013.01); *H01J 37/32724* (2013.01); *H01J 2237/20214* (2013.01)

(56) References Cited

U.S. PATENT DOCUMENTS

| | | |
|---|---|---|
| 6,770,146 B2 | 8/2004 | Koren et al. |
| 6,782,843 B2 | 8/2004 | Kinnard et al. |
| 6,800,833 B2 | 10/2004 | Gregor et al. |
| 8,111,978 B2 | 2/2012 | Sorabji et al. |
| 8,299,671 B2 | 10/2012 | Nomura et al. |
| 8,791,614 B2 | 7/2014 | Obweger et al. |
| 11,062,910 B2 | 7/2021 | Yang et al. |
| 11,062,912 B2 | 7/2021 | Ma |
| 2012/0234243 A1* | 9/2012 | Olgado ............. H01L 21/68742 118/729 |
| 2015/0131699 A1* | 5/2015 | Aderhold .............. G01J 5/0007 374/133 |
| 2017/0278761 A1* | 9/2017 | deVilliers ......... H01L 21/67103 |
| 2017/0316948 A1* | 11/2017 | Yamazawa ............ H01J 37/321 |
| 2019/0198301 A1 | 6/2019 | Ma et al. |

\* cited by examiner

WORKPIECE PROCESSING APPARATUS WITH PLASMA AND THERMAL PROCESSING SYSTEMS

FIELD

The present disclosure relates generally to semiconductor processing equipment, such as equipment operable to perform plasma processing and thermal processing of a workpiece.

BACKGROUND

Plasma processing is widely used in the semiconductor industry for materials deposition, materials modification, materials removal, and related processing of semiconductor wafers and other substrates. Plasma sources (e.g., inductively-coupled plasma source, capacitively-coupled plasma source, microwave plasma source, electron cyclotron resonance plasma source, etc.) are often used for plasma processing to produce high density plasma and reactive species for processing substrates. Reactive species in plasma can include positively and negatively charged ions, negatively charged electrons, charge-neutral radicals and other energetic neutral particles. In order to avoid charge damage of materials, charged species from a plasma generated in a remote plasma chamber can be filtered out while charge neutral radicals and other energetic neutral particles can pass through a separation grid into a processing chamber to treat a substrate, such as a semiconductor wafer.

Thermal processing is also used for processing workpieces. Generally, a thermal processing chamber as used herein refers to a device that heats workpieces, such as semiconductor workpieces. Such devices can include a support plate for supporting one or more workpieces and an energy source for heating the workpieces, such as heating lamps, lasers, or other heat sources. During heat treatment, the workpiece(s) can be heated under controlled conditions according to a processing regime.

Many thermal treatment processes require a workpiece to be heated over a range of temperatures so that various chemical and physical transformations can take place as the workpiece is fabricated into a device(s). During rapid thermal processing, for instance, workpieces can be heated by an array of lamps through the support plate to temperatures from about 300° C. to about 1,200° C. over time durations that are typically less than a few minutes. During these processes, a primary goal can be to reliably and accurately measure a temperature of the workpiece.

Plasma processing and thermal treatments often require two separate devices in order to effectively process workpieces, increasing manufacturing costs and time. Accordingly, improved processing apparatuses capable of performing both plasma processing and thermal treatments are desired.

SUMMARY

Aspects and advantages of embodiments of the present disclosure will be set forth in part in the following description, or may be learned from the description, or may be learned through practice of the embodiments.

Aspects of the present disclosure are directed to a processing apparatus for processing a workpiece. The processing apparatus includes a processing chamber; a plasma chamber separated from the processing chamber, the plasma chamber disposed on a first side of the processing chamber; a gas supply system configured to deliver one or more process gases to the plasma chamber; a plasma source configured to generate a plasma from the one or more process gases in the plasma chamber; a workpiece support disposed within the processing chamber, the workpiece support configured to support a workpiece, wherein a back side of the workpiece faces the workpiece support; one or more radiative heat sources configured on a second and opposite side of the first side of the processing chamber, the radiative heating sources configured to heat the workpiece from the back side of the workpiece; a dielectric window disposed between the workpiece support and the one or more radiative heat sources; and a rotation system configured to rotate the workpiece, the rotation system comprising a magnetic actuator.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
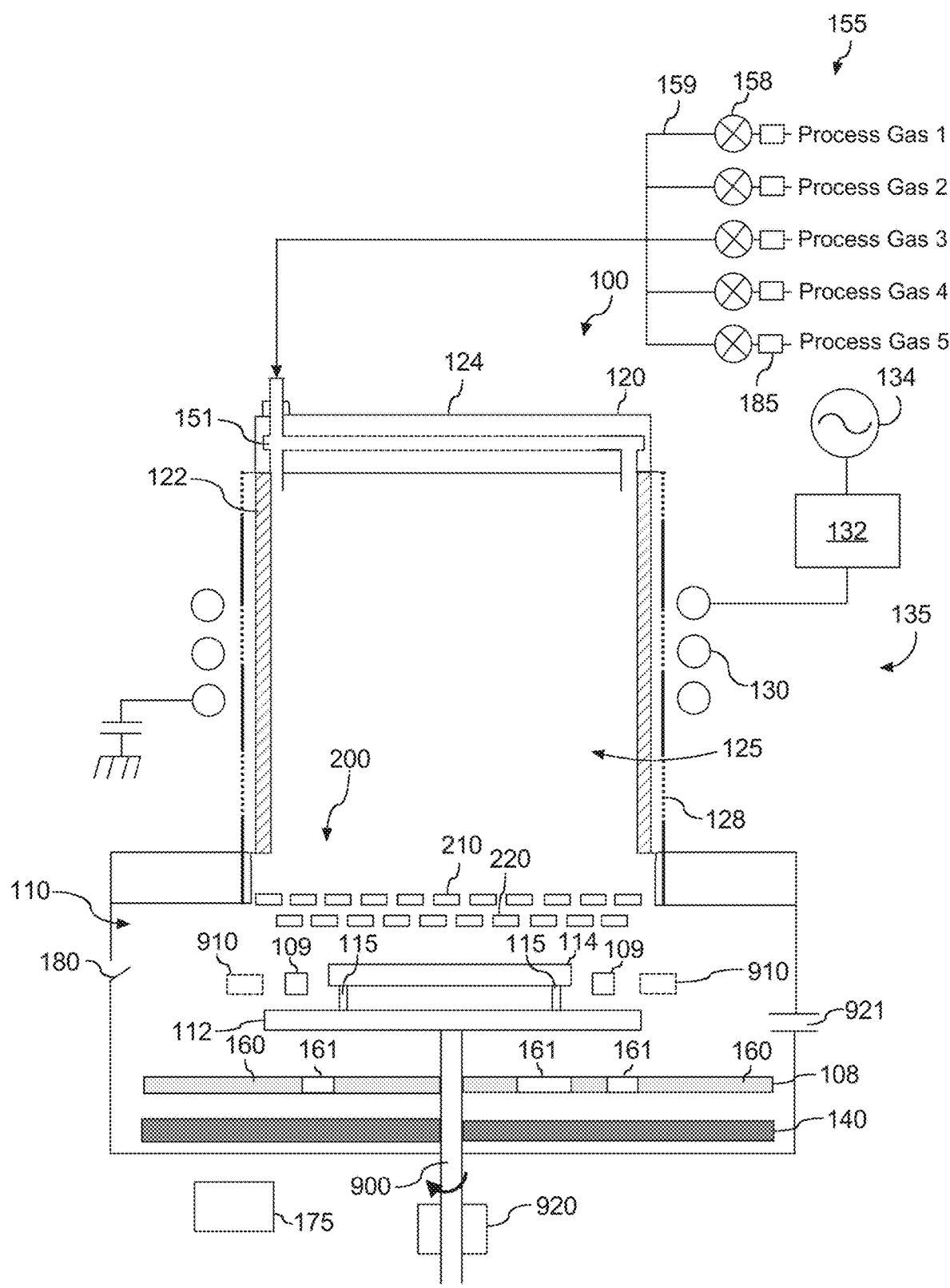
FIG. 1 depicts an example processing system according to example aspects of the present disclosure.
Figure 2:
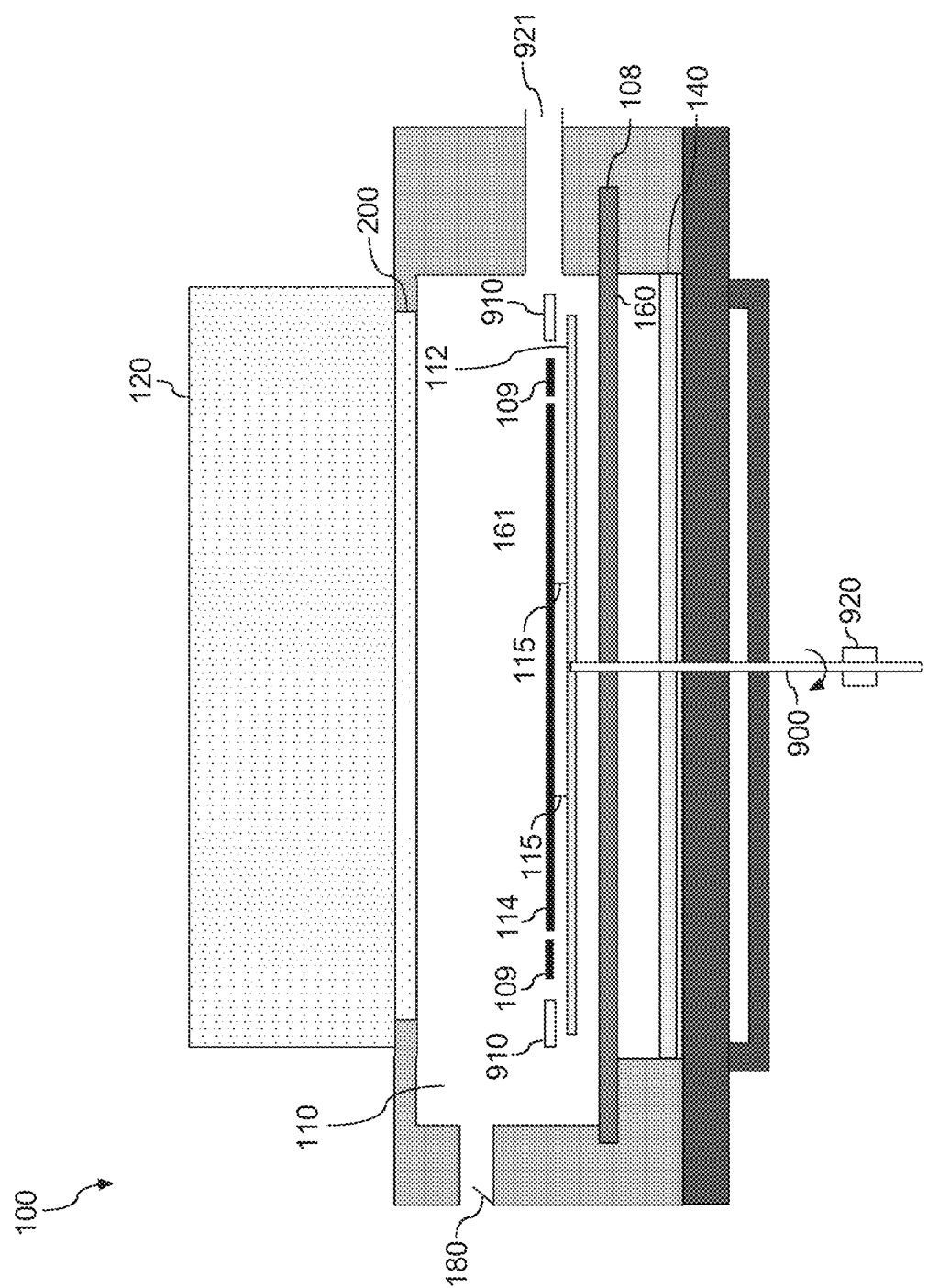
FIG. 2 depicts an example processing system according to example aspects of the present disclosure.
Figure 3:
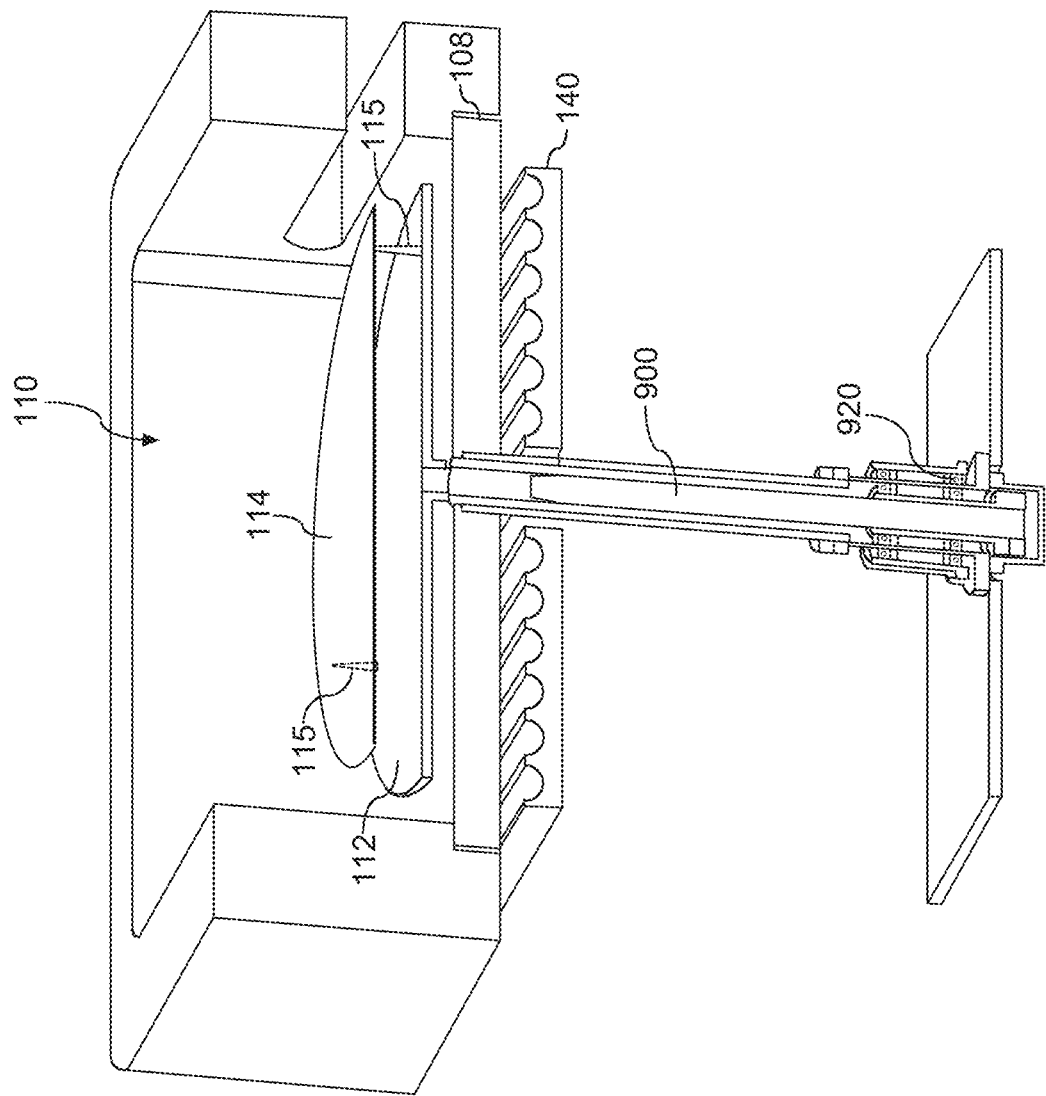
FIG. 3 depicts an example processing system according to example aspects of the present disclosure.
Figure 4:
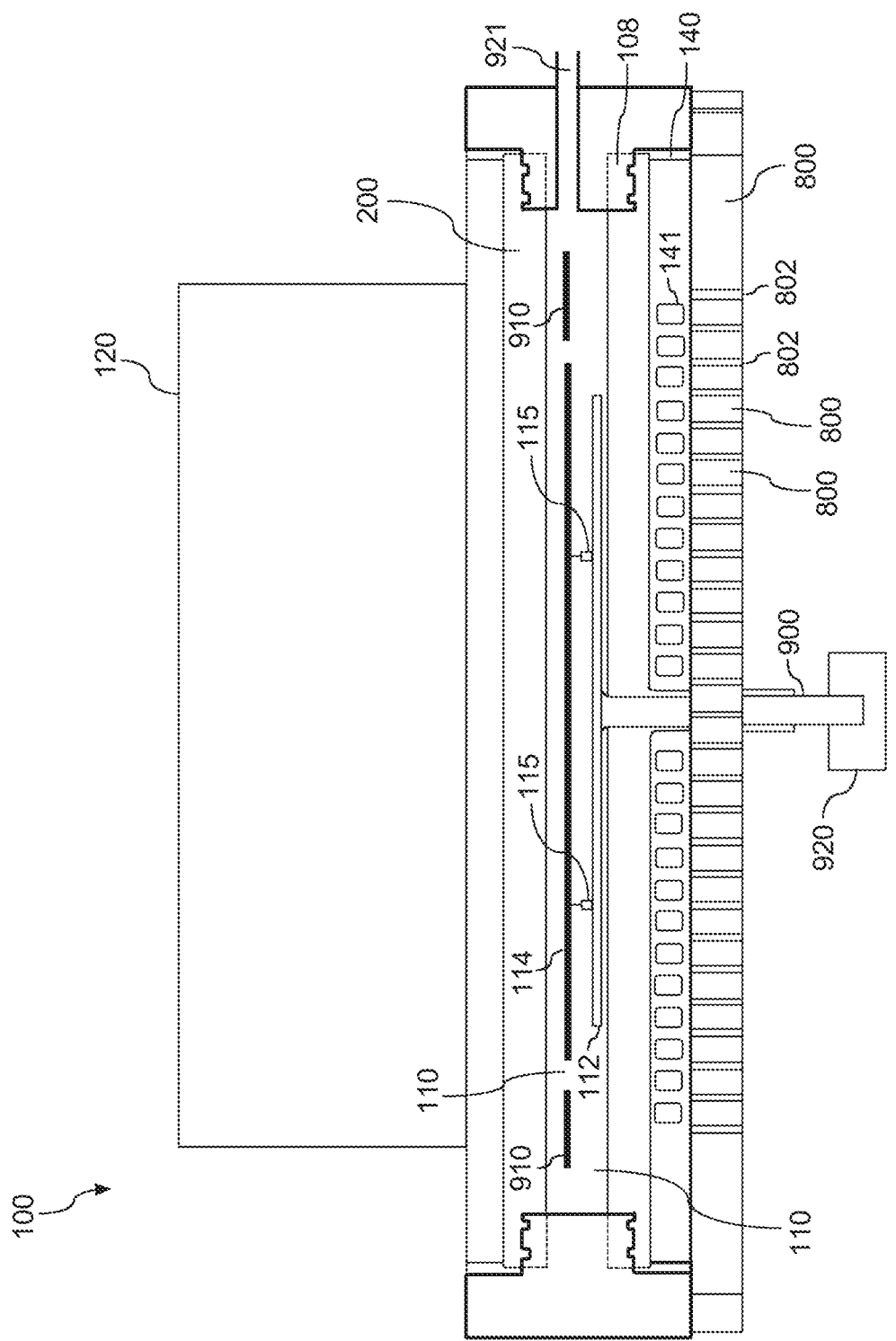
FIG. 4 depicts an example processing system according to example aspects of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Various workpiece processing treatments can require plasma treatment, heat treatment, or both. Typically, plasma treatments and heat treatments, such as rapid thermal processing, must be performed in different devices or processing chambers in order to accurately control process parameters. Furthermore, it has been difficult to obtain accurate workpiece temperature measurements of workpieces during plasma and thermal processing.

Accordingly, aspects of the present disclosure provide a number of technical effects and benefits. For instance, the plasma processing apparatus provided herein allows for the ability to conduct both plasma and thermal treatments in the same processing chamber, thus saving fabrication time and money and can lead to reduce footprint in semiconductor processing facilities. Furthermore, the apparatus provided herein includes a rotation system including a magnetic actuator capable of efficiently rotating the workpiece during processing.

Variations and modifications can be made to these example embodiments of the present disclosure. As used in the specification, the singular forms "a," "and," and "the" include plural referents unless the context clearly dictates otherwise. The use of "first," "second," "third," etc., are used as identifiers and are not necessarily indicative of any ordering, implied or otherwise. Example aspects may be discussed with reference to a "substrate," "workpiece," or "workpiece" for purposes of illustration and discussion. Those of ordinary skill in the art, using the disclosures provided herein, will understand that example aspects of the present disclosure can be used with any suitable workpiece. The use of the term "about" in conjunction with a numerical value refers to within 20% of the stated numerical value.

FIG. 1 depicts an example plasma processing apparatus 100 that can be used to perform processes according to example embodiments of the present disclosure. As illustrated, plasma processing apparatus 100 includes a processing chamber 110 and a plasma chamber 120 that is separated from the processing chamber 110. Processing chamber 110 includes a workpiece support 112 or pedestal operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of workpiece 114 through a separation grid assembly 200.

Workpiece 114 can be or include any suitable workpiece, such as a semiconductor workpiece, such as a silicon wafer. In some embodiments, workpiece 114 can be or include a lightly doped silicon wafer. For example, a lightly doped silicon wafer can be doped such that a resistivity of the silicon wafer is greater than about 0.1 Ω·cm, such as greater than about 1 Ω·cm.

Aspects of the present disclosure are discussed with reference to an inductively coupled plasma source for purposes of illustration and discussion. Those of ordinary skill in the art, using the disclosures provided herein, will understand that any plasma source (e.g., inductively coupled plasma source, capacitively coupled plasma source, etc.) can be used without deviating from the scope of the present disclosure.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. Dielectric side wall 122 can be formed from a ceramic material. The inductively coupled plasma source 135 can include an induction coil 130 disposed adjacent the dielectric side wall 122 about the plasma chamber 120. The induction coil 130 is coupled to an RF power generator 134 through a suitable matching network 132. The induction coil 130 can be formed of any suitable material, including conductive materials suitable for inducing plasma within the plasma chamber 120. Process gases can be provided to the chamber interior 125 from gas supply 155 and annular gas distribution channel 151 or other suitable gas introduction mechanism (e.g. a showerhead). When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma. The grounded Faraday shield 128 can be formed of any suitable material or conductor, including materials similar or substantially similar to the induction coil 130.

As shown in FIG. 1, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber 110.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded. In some embodiments, the grid assembly can include a single grid with one grid plate.

In some embodiments, the grid plate can have one or more cooling mechanisms disposed therein for cooling the grid plate during operation of the processing apparatus. For example, one or more cooling channels can be disposed in the grid plate. Air or fluid (e.g., water) can be pumped through the cooling channels to decrease the temperature of the grid plate. Other known cooling chemicals can be pumped through the cooling channels for cooling the grid plate.

Example embodiments of a processing apparatus will now be discussed with reference to FIGS. 1-5 and 8-12. As shown in FIG. 1, according to example aspects of the present disclosure, the apparatus 100 can include a gas delivery system 155 configured to deliver process gas to the plasma chamber 120, for instance, via gas distribution channel 151 or other distribution system (e.g., showerhead). The gas delivery system can include a plurality of feed gas lines 159. The feed gas lines 159 can be controlled using valves 158 and/or gas flow controllers 185 to deliver a desired amount of gases into the plasma chamber as process gas. The gas delivery system 155 can be used for the delivery of any suitable process gas. Example process gases include, oxygen-containing gases (e.g. $O_2$, $O_3$, $N_2O$), hydrogen-containing gases (e.g., $H_2$, $D_2$), nitrogen-containing gas (e.g. $N_2$, $NH_3$, $N_2O$), fluorine-containing gases (e.g. $CF_4$, $C_2F_4$, $CHF_3$, $CH_2F_2$, $CH_3F$, $SF_6$, $NF_3$), hydrocarbon-containing gases (e.g. $CH_4$), or combinations thereof. Other feed gas lines containing other gases can be added as needed. In some embodiments, the process gas can be mixed with an inert gas that can be called a "carrier" gas, such as He, Ar, Ne, Xe, or $N_2$. A control valve 158 can be used to control a flow rate of each feed gas line to flow a process gas into the plasma chamber 120. In embodiments, the gas delivery system 155 can be controlled with a gas flow controller 185.

The workpiece 114 to be processed is supported in the processing chamber 110 by the workpiece support 112. The workpiece support 112 can be a workpiece support operable to support a workpiece 114 during thermal processing (e.g., a workpiece support plate). Workpiece support 112 can be or include any suitable support structure configured to support workpiece 114, such as to support workpiece 114 in processing chamber 110. In some embodiments, workpiece support 112 can be configured to support a plurality of workpieces 114 for simultaneous thermal processing by a thermal processing system. In some embodiments, workpiece support 112 can rotate workpiece 114 before, during, and/or after thermal processing. In some embodiments, workpiece support 112 can be transparent to and/or otherwise configured to allow at least some electromagnetic radiation to at least partially pass through workpiece support 112. For instance, in some embodiments, a material of workpiece support 112 can be selected to allow desired electromagnetic radiation to pass through workpiece support 112, such as electromagnetic radiation that is emitted by workpiece 114. In some embodiments, workpiece support 112 can be or include a quartz material, such as a hydroxyl free quartz material.

Workpiece support 112 can include one or more support pins 115, such as at least three support pins, extending from workpiece support 112. In some embodiments, workpiece support 112 can be spaced from the top of the processing chamber 110, such as spaced from separation grid 220. In some embodiments, the support pins 115 and/or the workpiece support 112 can transmit heat from heat sources 140 and/or absorb heat from workpiece 114. In some embodiments, the support pins 115 can be made of quartz.

Processing apparatus 100 can include one or more heat sources 140. In some embodiments, heat sources 140 can include one or more heating lamps 141. For example, heat sources 140 including one or more heating lamps can emit electromagnetic radiation to heat workpiece 114. In some embodiments, for example, heat sources 140 can be broadband electromagnetic radiation sources including arc lamps, tungsten-halogen lamps, any other suitable heating lamp, or combinations thereof. In some embodiments, heat sources 140 can be monochromatic electromagnetic radiation sources including light-emitting diodes, laser diodes, any other suitable heating lamps, or combinations thereof. The heat source 140 can include an assembly of heating lamps 141, which are positioned, for instance, to heat different zones of the workpiece 114. The energy supplied to each heating zone can be controlled while the workpiece 114 is heated. Further, the amount of radiation applied to various zones of the workpiece 114 can also be controlled in an open-loop fashion. In this configuration, the ratios between the various heating zones can be pre-determined after manual optimization. In other embodiments, the amount of radiation applied to various zones of the workpiece 114 can be controlled in a closed-loop fashion.

In certain embodiments, directive elements, such as for example, reflectors 800 (e.g., mirrors) can be configured to direct electromagnetic radiation from one or more heating lamps 141 towards a workpiece 114 and/or workpiece support 112. For example, one or more reflectors 800 can be disposed with respect to the heat sources 140 as shown in FIGS. 4-5 and 11-12. One or more cooling channels 802 can be disposed between or within the reflectors 800. As shown by arrows 804 in FIGS. 5 and 12, ambient air can pass through the one or more cooling channels 802 to cool the one or more heat sources 140, such as the heat lamps 141.

According to example aspects of the present disclosure, one or more dielectric windows 108 can be disposed between the heat source 140 and the workpiece support 112. According to example aspects of the present disclosure, window 108 can be disposed between workpiece 114 and heat sources 140. Window 108 can be configured to selectively block at least a portion of electromagnetic radiation (e.g., broadband radiation) emitted by heat sources 140 from entering a portion of the processing chamber 110. For example, window 108 can include opaque regions 160 and/or transparent regions 161. As used herein, "opaque" means generally having a transmittance of less than about 0.4 (40%) for a given wavelength, and "transparent" means generally having a transmittance of greater than about 0.4 (40%) for a given wavelength.

Opaque regions 160 and/or transparent regions 161 can be positioned such that the opaque regions 160 block stray radiation at some wavelengths from the heat sources 140, and the transparent regions 161 allow for other components of the apparatus 100 to freely interact with radiation in processing chamber 110 at the wavelengths blocked by opaque regions 160. In this way, the window 108 can effectively shield the processing chamber 110 from contamination by heat sources 140 at given wavelengths while still allowing the heat sources 140 to heat workpiece 114. Opaque regions 160 and transparent regions 161 can generally be defined as opaque and transparent, respectively, to a particular wavelength; that is, for at least electromagnetic radiation at the particular wavelength, the opaque regions 160 are opaque and the transparent regions 161 are transparent.

Window 108, including opaque regions 160 and/or transparent regions 161, can be formed of any suitable material and/or construction. In some embodiments, dielectric window 108 can be or include a quartz material. Furthermore, in some embodiments, opaque regions 160 can be or include hydroxyl (OH) containing quartz, such as hydroxyl doped quartz (e.g., quartz that contains significant amounts of hydroxyl groups), and/or transparent regions 161 can be or include hydroxyl free quartz (e.g., quartz contains minimum amounts of hydroxyl groups). Advantages of selecting hydroxyl doped quartz and hydroxyl free quartz materials can include ease of manufacturing. Additionally, hydroxyl doped quartz and hydroxyl free quartz can exhibit desirable wavelength blocking properties in accordance with the present disclosure. For instance, hydroxyl doped quartz can block radiation having a wavelength of about 2.7 micrometers, while hydroxyl free quartz can be transparent to radiation having a wavelength of about 2.7 micrometers.

Figure 5:
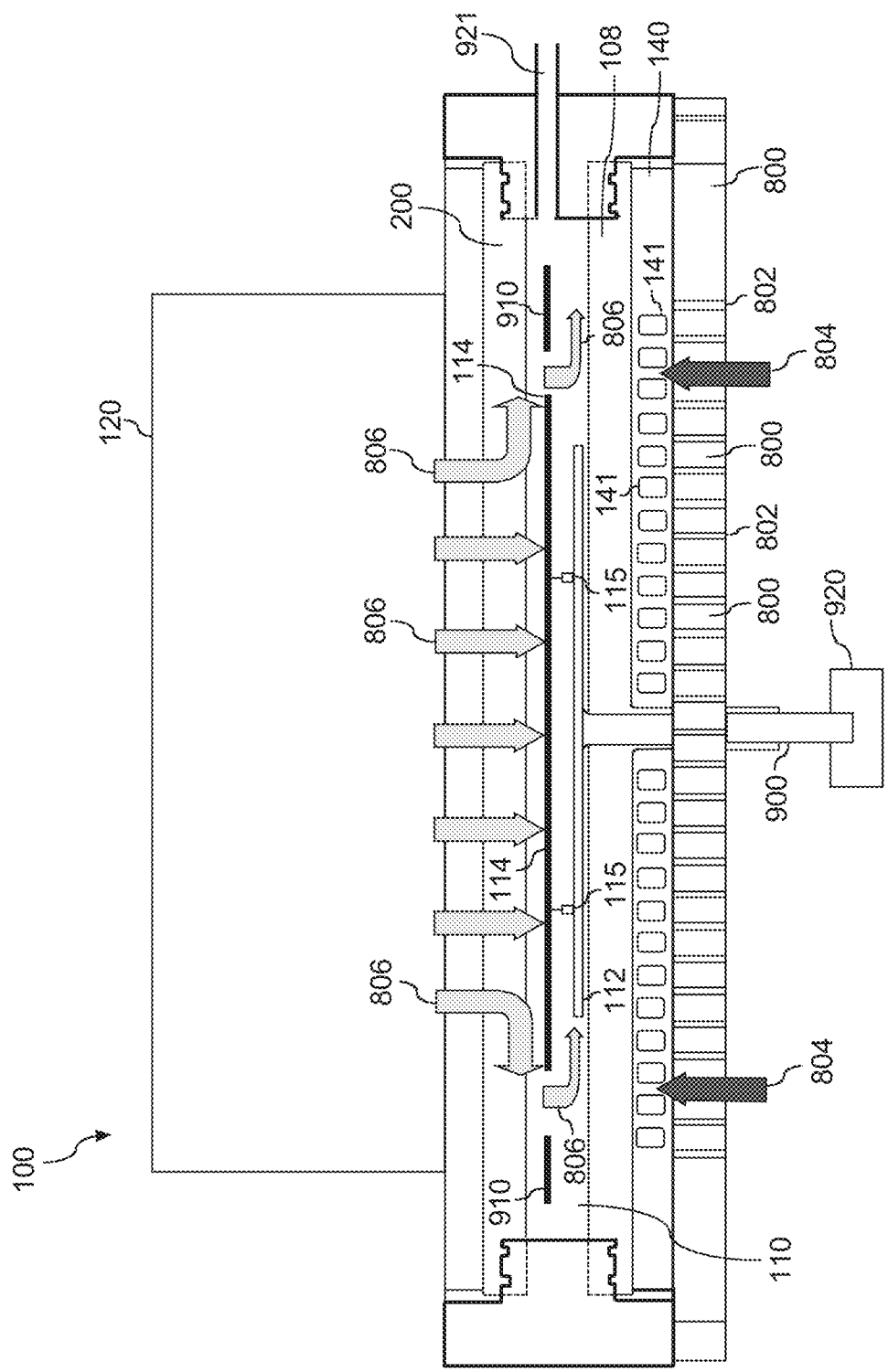
FIG. 5 depicts an example processing system according to example aspects of the present disclosure.
Figure 12:
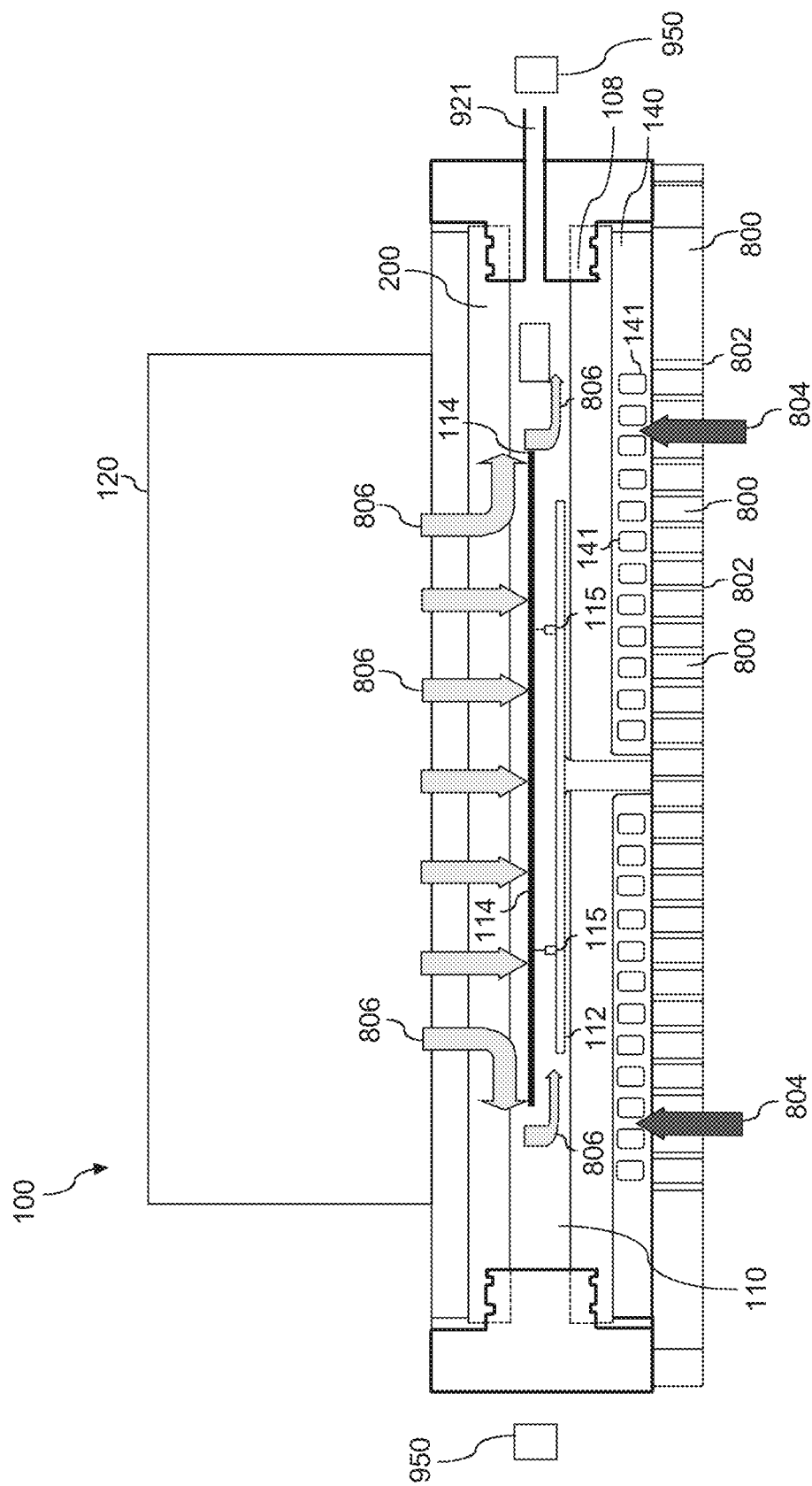
FIG. 12 depicts an example processing system according to example aspects of the present disclosure.

One or more exhaust ports 921 can be disposed in the processing chamber 110 that are configured to pump gas out of the processing chamber 110, such that a vacuum pressure can be maintained in the processing chamber 110. For example, process gas can flow from the plasma chamber 120 through the one or more separation grids 200 and enter the processing chamber 110 according to the arrows as depicted in FIGS. 5 and 12. The process gas is exposed to the workpiece 114 and then flows around either side of the workpiece 114 and is evacuated from the processing chamber 110 via one or more exhaust ports 921. The flow of the process gas is shown by arrows 806 in FIGS. 5 and 12. One or more pumping plates 910 can be disposed around the outer perimeter of the workpiece 114 to facilitate process gas flow.

In embodiments, the apparatus 100 can include a controller 175. The controller 175 controls various components in processing chamber 110 to direct processing of workpiece 114. For example, controller 175 can be used to control heat sources 140. Additionally and/or alternatively, controller 175 can be used to control the door 180. The controller 175 can include, for instance, one or more processors and one or more memory devices. The one or more memory devices can store computer-readable instructions that when executed by the one or more processors cause the one or more processors to perform operations, such as any of the control operations described herein.

In certain embodiments, the apparatus 100 is configured to include a rotation mechanism capable of rotating the workpiece 114. For instance, during processing of the workpiece 114 (e.g., thermal processing) the workpiece 114 can be continually rotated such that heat generated by the one or more heat sources 140 can evenly heat the workpiece 114. In some embodiments, rotation of the workpiece 114 forms radial heating zones on the workpiece 114, which aid in heating the workpiece 114 uniformly and can provide good temporal control during the heating cycle.

For example, as shown in FIGS. 1-5, the apparatus 100 includes a rotation mechanism including a rotation shaft 900. The rotation shaft 900 is disposed such that it passes through the dielectric window 108 and into the processing chamber 110. The rotation shaft 900 is configured to support the workpiece support 112 in the processing chamber 110. For example, the rotation shaft 900 is coupled on one end to the workpiece support 112 and is coupled about the other end to a magnetic actuator 920 capable of rotating the rotation shaft 900 360°. The magnetic actuator 920 can be any device capable of generating magnetic forces. For instance, the magnetic actuator 920 can generate a magnetic force field that is capable of influencing the rotation shaft 900, such that the rotation shaft 900 can be rotated about its center axis.

In certain embodiments, it will be appreciated that a portion of the rotation shaft 900 is disposed in the processing chamber 110 while another portion of the rotation shaft 900 is disposed outside the processing chamber 110 in a manner such that a vacuum pressure can be maintained in the processing chamber 110. For example, during processing of the workpiece 114 a vacuum pressure may need to be maintained in the processing chamber 110. Additionally, the workpiece 114 will need to be rotated during processing. Accordingly, the rotation shaft 900 is positioned through the dielectric window 108 and in the processing chamber 110, such that the rotation shaft 900 can facilitate rotation of the workpiece 114 while a vacuum pressure is maintained in the processing chamber 110.

In embodiments, the magnetic actuator 920 can include a rotary motion feedthrough device for coupling rotary motion with the rotation shaft that includes a dynamic magnetic seal formed of magnets separated by pole rings, which rings can be formed integral with the shaft to form a magnetic system which rotates with the shaft. Suitable examples of rotary motion feedthrough systems are described in U.S. Pat. No. 5,975,536, which is incorporated by reference herein.

Figure 7:
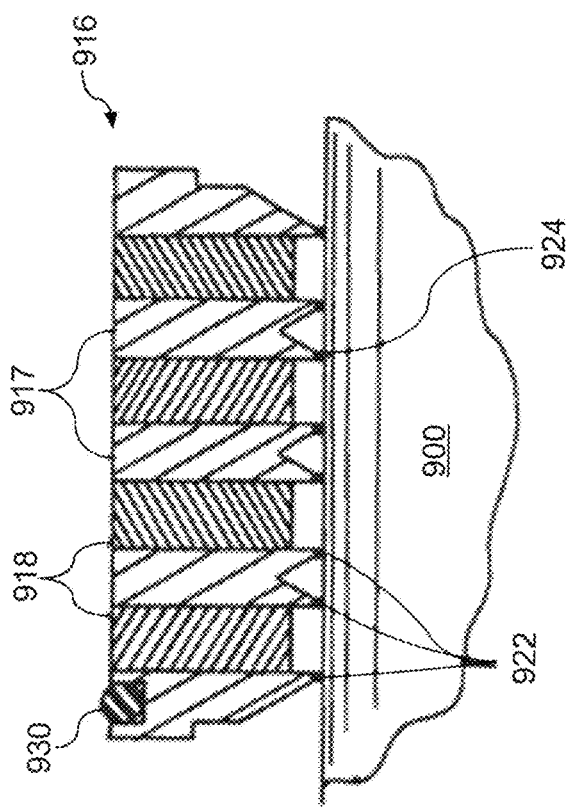
FIG. 7 depicts an example magnetic actuator according to example aspects of the present disclosure.
Figure 6:
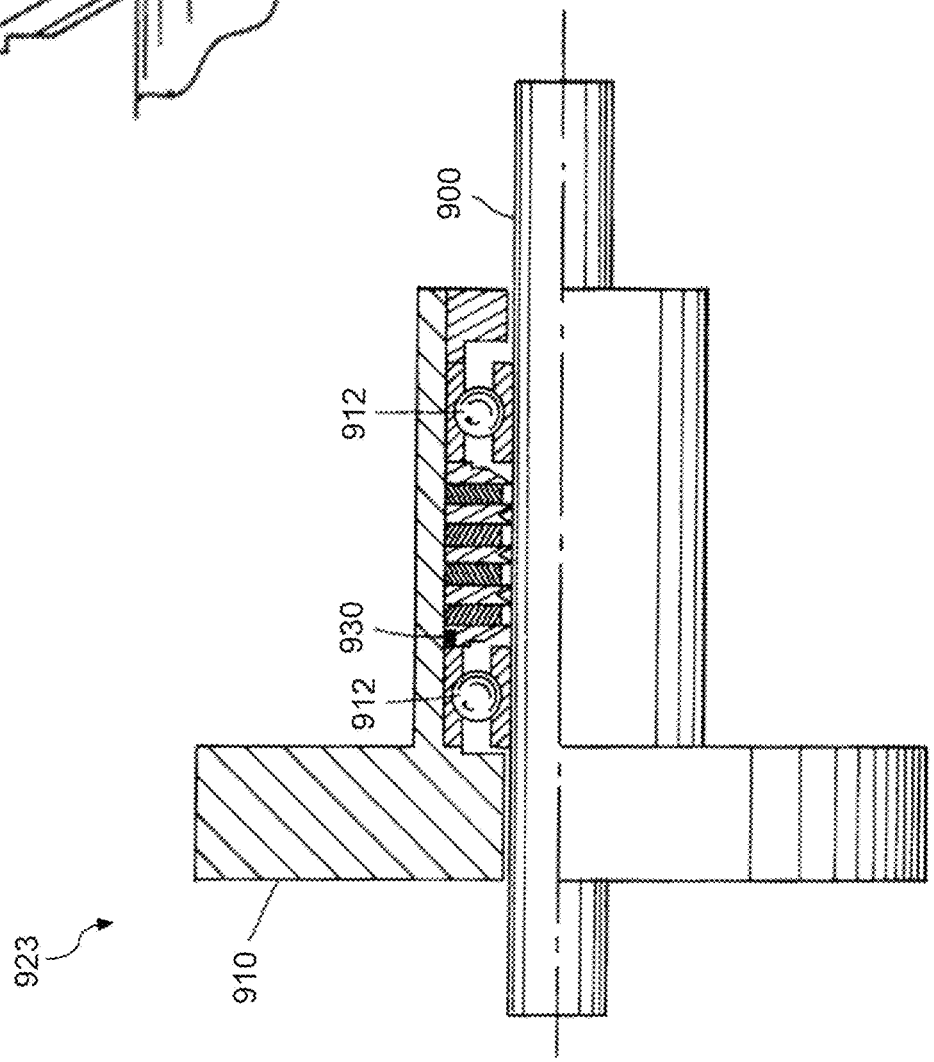
FIG. 6 depicts an example magnetic actuator according to example aspects of the present disclosure.

Ferrofluid sealed rotary feedthroughs are well known in the art as devices for transmitting motion through the walls of vacuum chambers. A typical rotary motion feedthrough device 923 is shown in FIGS. 6 and 7. The rotary motion feedthrough device employs a housing 910, bearings 912 and rotation shaft 900, together with a magnet system 916 that is non-rotatably fixed within the housing 910. The magnet system 916 comprises at least one ring magnet 918 and associated magnetic pole piece components 917. Small annular gaps 922 bounded by the outside of the shaft and the inside of the pole piece components are filled with ferrofluid 924 (a colloidal suspension of ferromagnetic particles in a low vapor pressure fluid), which is held in place by the intense magnetic field generated by the magnet system 916. The ferrofluid permits the rotation shaft 900 to turn freely but serves to block the flow of gas axially along the shaft. The particular design shown in FIGS. 5 and 6 uses four ring magnets 918 and five pole rings 917 to produce eight sealing gaps 922. Other magnetic designs e.g., one ring magnet with two pole rings are well known.

Sealing is accomplished in two places in rotary feedthroughs. The first seal is the dynamic seal provided by the ferrofluid between the rotation shaft 900 and pole pieces 917. The second is the static seal provided by O-rings 930 or other materials which seal the spaces between the housing and the outer diameter of the pole piece 917.

The rotation shaft 900 can be formed of ferromagnetic material capable of being influenced by a magnetic force. In embodiments, the rotation shaft 900 can be formed of a ferromagnetic material suitable for use in the intended process (vacuum) environment in which one end of the rotation shaft 900 is exposed to the ambient atmosphere 926, and the opposite end extends through one or more dielectric windows (e.g., dielectric window 108) into a vacuum environment in the processing chamber 110. For instance, magnetic stainless steels (e.g., 17-4PH) may be used as a material for the rotation shaft 900 for most applications. Several ferromagnetic stainless steels are well known as suitable materials for ferrofluid rotary feedthroughs. Any of them may be used in connection with this disclosure.

In other embodiments, the rotation shaft 900 can be coupled to a translation device that is capable of moving the rotation shaft 900 and the workpiece support 112 up and down in a vertical manner. (Not shown). For example, when loading or unloading workpiece 114 from the processing chamber 110, it may be desired to raise the workpiece 114 via the workpiece support 112 so that removal devices can be used to easily access the workpiece 114 and remove it from the processing chamber 110. Example removal devices may include robotic susceptors. In other embodiments, the workpiece support 112 may need to be vertically moved in order to provide routine maintenance on the processing chamber 110 and elements associated with the processing chamber 110. Suitable translations devices that may be coupled to the rotation shaft 900 include bellows or other mechanical or electrical devices capable of translating the rotation shaft 900 in a vertical motion.

Referring now to FIGS. 8-12, in embodiments, the magnetic actuator 920 can include a magnetic levitation device 950 disposed around the workpiece 114. For example, in certain embodiments, the magnetic levitation device 950 is disposed around the workpiece 114 around the outside wall of the processing chamber 110. In other embodiments, it is contemplated that the magnetic levitation device can be disposed in the processing chamber 110. Still in other embodiments, certain components of the magnetic levitation device 950, for example rotors, can be disposed inside the processing chamber 110 and other components of the magnetic levitation device 950, such as magnets, can be disposed outside the wall of the processing chamber 110. The magnetic levitation device 950 is capable of generating a magnetic field for levitating and rotating the workpiece 114. The magnetic levitation device 950 is positioned around the processing chamber 110 and can be secured at a fixed location. For example, during processing, the workpiece 114 is placed on one or more pins 115 atop the workpiece support 112. The magnetic levitation device 950 is positioned with respect to the workpiece support 112, such that when the magnetic field is produced by the magnetic levitation device 950, the workpiece support 112 is rotated, which rotates the workpiece 114. The magnetic levitation device 950 can be magnetically coupled to the workpiece support 112. In other embodiments, it is contemplated that the magnetic levitation device 950 is positioned with respect to the workpiece 114, such that when the magnetic field is produced by the magnetic levitation device 950, the workpiece 114 is lifted from the one or more pins 115 and is rotated by the magnetic field. As such, in certain embodiments, the magnetic levitation device 950 is configured to move the workpiece 114 in a vertical direction. The magnetic levitation device 950 can include those available from Levitronics, in Zurich, Switzerland.

Figure 13:
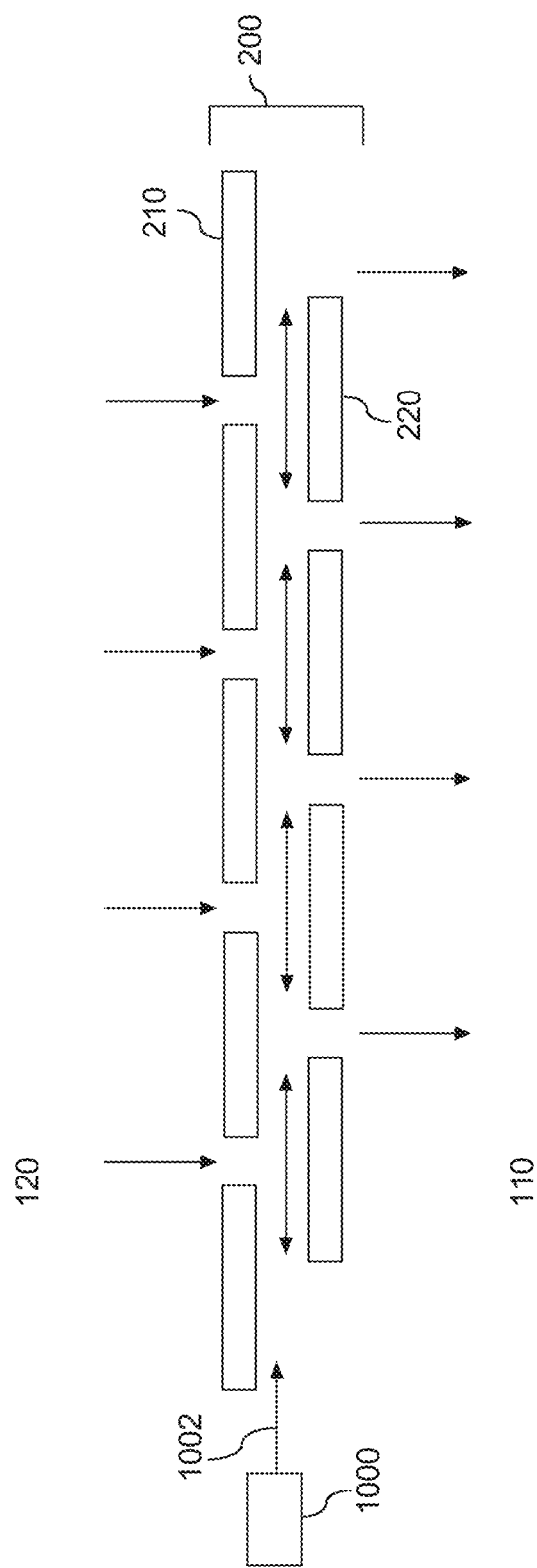
FIG. 13 depicts an example post plasma gas injection system according to example embodiments of the present disclosure.

FIG. 13 illustrates an example post plasma gas injection at a separation grid according to example embodiments of the disclosure. FIG. 13 will be discussed with reference to the processing apparatus 100 of FIG. 1 by way of example.

According to example aspects of the present disclosure, the processing apparatus 100 can include one or more gas ports 1000 configured to inject a gas into the neutral species flowing through the separation grid 200. For instance, a gas port 1000 can be operable to inject a gas (e.g., a cooling gas) between grid plates in a multi-plate separation grid. In this way, the separation grid can provide post plasma gas injection into the neutral species. The post plasma gas injection can provide a number of technical effects and benefits. For example, the gas can be injected to control uniformity characteristics of a process. For example, a neutral gas (e.g., inert gas) can be injected to control uniformity, such as uniformity in a radial direction with respect to the workpiece. Cooling gas can be injected to control the energy of radicals passing through the separation grid.

The separation grid 200 can be a multi-plate separation grid (e.g., a dual-plate grid shown in FIG. 1, a three-plate grid, a four-plate grid, etc.). As shown in FIG. 13, the processing apparatus 100 can include a gas port 1000 configured to inject a gas 1002 between grid plate 210 and grid plate 220, such as in the channel formed between grid plate 210 and grid plate 220. More particularly, the mixture of ions and neutral species generated in the plasma can be exposed to grid plate 210. The gas port 1000 can inject a gas 1002 or other substance into neutral species flowing through the grid plate 210. Neutral species passing through grid plate 220 can be exposed to a workpiece. In some embodiments, the gas port 1000 can inject a gas 1002 directly into the processing chamber 110 at a location below the separation grid 200 and above the surface of the workpiece 114.

The gas 1002 or other substance from the gas port 1000 can be at a higher or lower temperature than the radicals coming from the plasma chamber 120 or can be the same temperature as the radicals from the plasma chamber 120. The gas can be used to adjust or correct uniformity, such as radical uniformity, within the plasma processing apparatus 100, by controlling the energy of the radicals passing through the separation grid 200. The non-process gas may include a dilution gas, such as nitrogen ($N_2$) and/or an inert gas, such as helium (He), argon (Ar) or other inert gas. In some embodiments, the gas 1002 can be an inert gas, such as helium, nitrogen, and/or argon.

Figure 14:
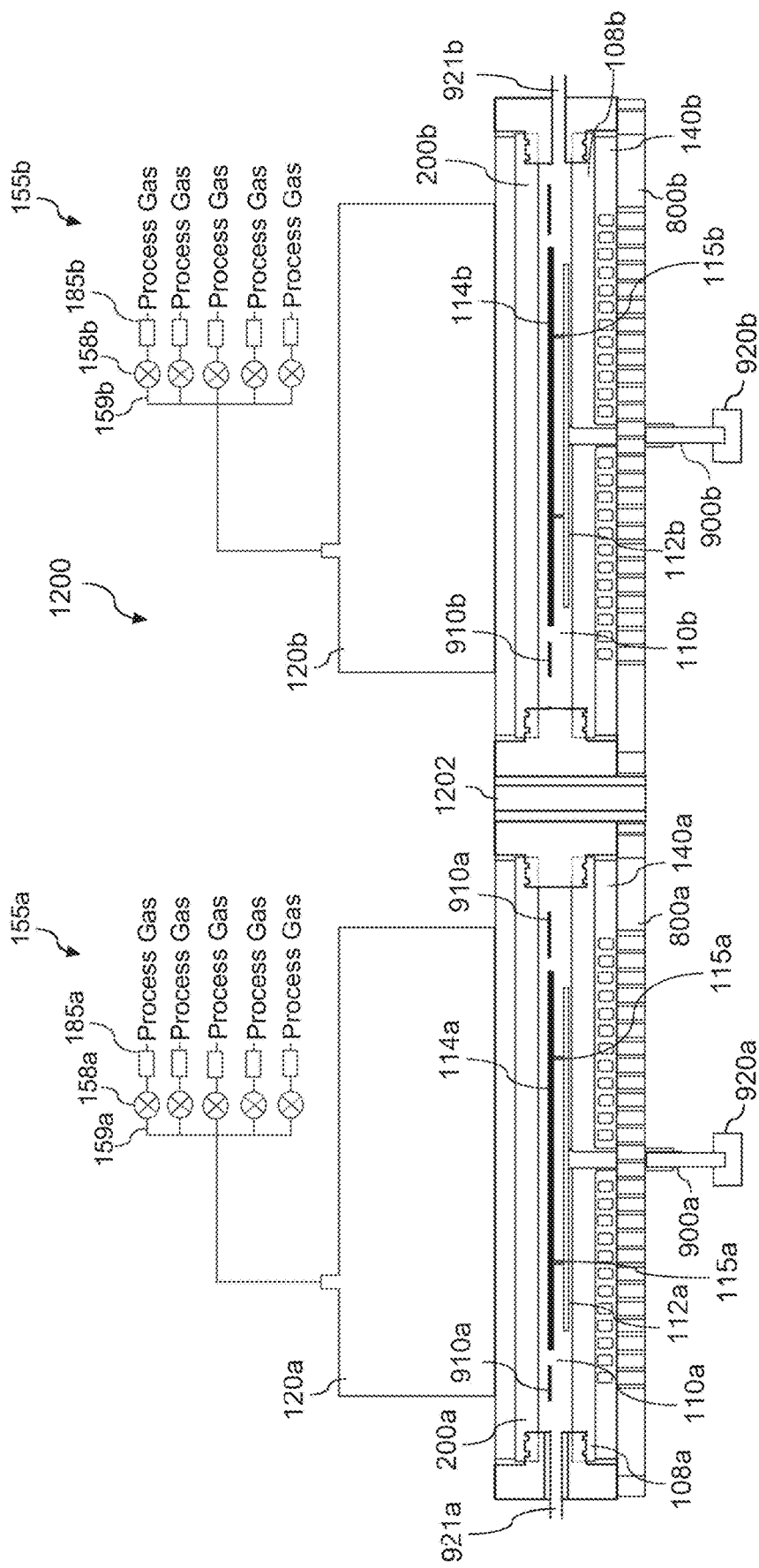
FIG. 14 depicts an example processing system according to example aspects of the present disclosure.
Figure 15:
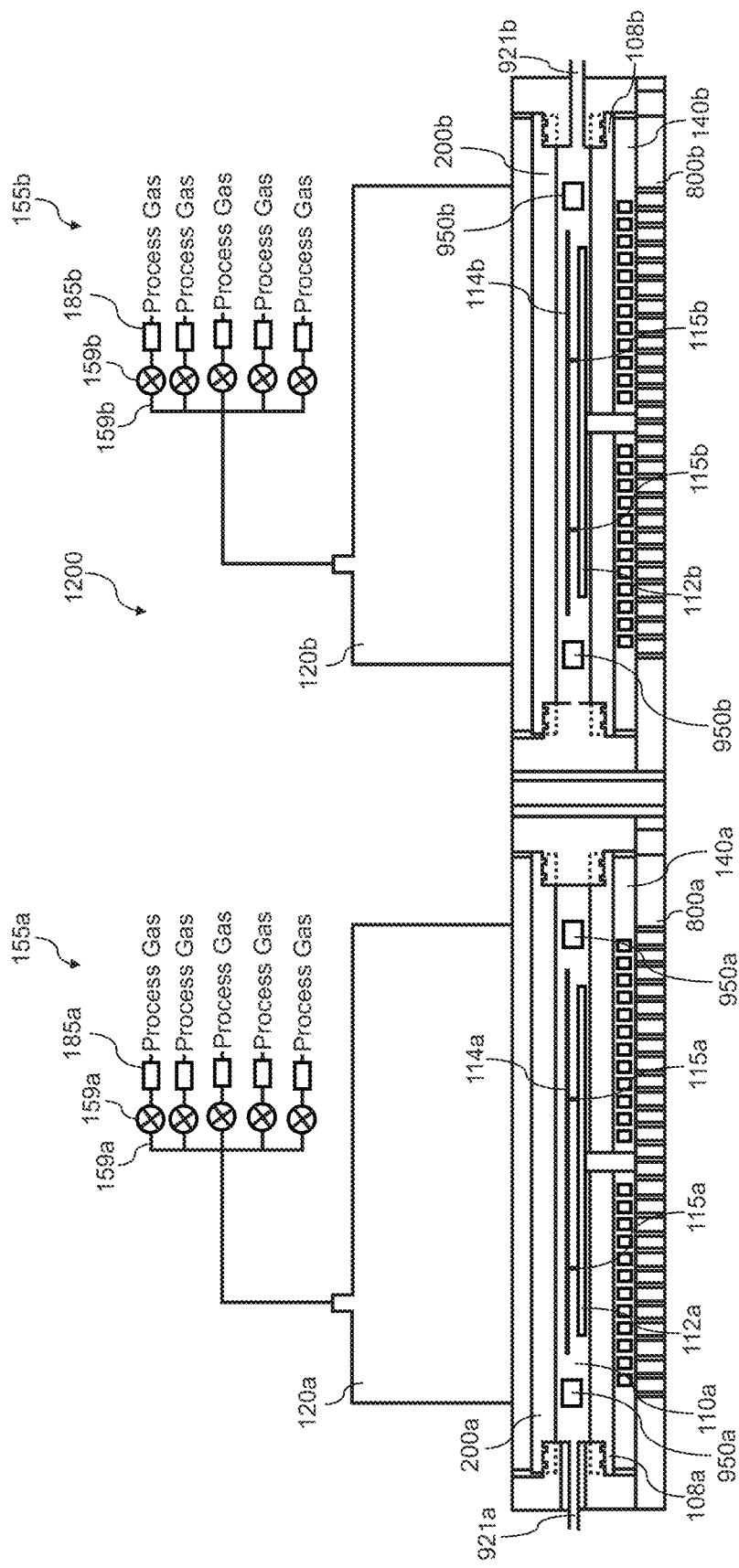
FIG. 15 depicts an example processing system according to example aspects of the present disclosure.

In embodiments, the processing apparatus can have a dual configuration as shown in FIGS. 14-15. For example, the processing apparatus 1200 includes plasma chambers 120a, 120b and processing chambers 110a,110b. In embodiments, the processing chambers 110a,110b can be divided by a wall 1202. In other embodiments, however, it is contemplated that the processing chamber 110 includes an undivided processing chamber. As shown, a workpiece supports 112a, 112b are disposed in the processing chambers 110a,110b for supporting workpieces 114a,114b. One or more heat sources 140a,140b are disposed on an opposite side of the processing chambers 110a,110b from the plasma chambers 120a, 120b. One or more separation grids 200a,200b separate the processing chambers 110a,110b from the plasma chambers 120a,120b. One or more dielectric windows 108a,108b are disposed between the heat sources 140a,140b and the workpiece supports 112a,112b.

The apparatus 1200 can include gas delivery systems 155a,155b configured to deliver process gas to the processing chambers 110a,110b, for instance, via gas distribution channels 151a,151b or other distribution system (e.g., showerhead). The gas delivery systems 155a,155b can include a plurality of feed gas lines 159a,159b. The feed gas lines 159a,159b can be controlled using valves 158a,158b and/or gas flow controllers 185a,185b to deliver a desired amount of gases into the plasma chamber as process gas. The gas delivery systems 155a,155b can be used for the delivery of any suitable process gas. Control valves 158a,158b can be used to control a flow rate of each feed gas line to flow a process gas into the processing chambers 110a,110b. In embodiments, the gas delivery systems 155a,155b can be controlled with gas flow controllers 185a,185b. In embodiments, the gas distribution system 155 can be a unitary system including feed gas lines 159 coupled to a single gas distribution line capable of delivering process gas into plasma chambers 110a,110b via gas distribution channels 151 (not shown in the figures).

Figure 16:
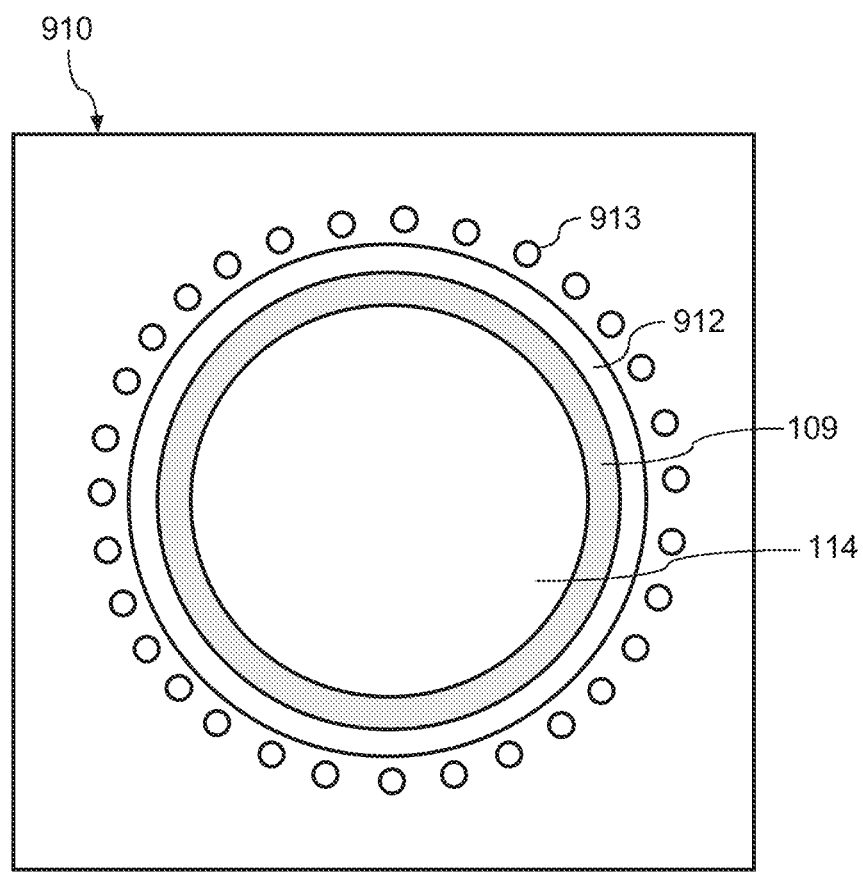
FIG. 16 depicts an example pumping plate according to example aspects of the present disclosure.

As shown in FIG. 15, rotation shafts 900a,900b are coupled to the workpiece supports 112a,112b for rotating the workpiece supports 112a,112b in the processing chamber 110a,110b. The rotation shafts 900a,900b are coupled to magnetic actuators 920a,920b. Portions of the rotation shafts 900a,900b may be disposed in the processing chambers 110a,110b, while other portions of the rotations shafts 900a,900b are disposed outside of the processing chambers 110a,110b, such that a vacuum pressure can be maintained in the processing chambers 110a,110b while the rotation shafts 900a,900b facilitate rotation of workpieces 114a, 114b. In other embodiments, as shown in FIG. 16, the rotation system includes magnetic actuators comprising magnetic levitation devices 950a,950b disposed in the processing chambers 110a,110b. For example, the magnetic levitation devices can be securely fixed around the workpiece supports 112a,112b and/or the workpieces 114a,114b. The magnetic levitation devices 950a,950b are secured at fixed locations in the interior of the processing chambers 110a,110b.

Such dual configurations allow for the processing of multiple workpieces. For example, a workpiece can be transferred and processed in processing chamber 110a while another workpiece is simultaneously processed in processing chamber 110b. For example, the workpiece in the first processing chamber 110a can be processed via a suitable plasma and/or thermal treatment while another workpiece in the second processing chamber 110b can be processed via a suitable plasma and/or thermal treatment.

Referring now to FIG. 16, illustrated is an example pumping plate 910 that can be used in embodiments provided. The pumping plate 910 includes one or more pumping channels 912, 913 for the flow of gas through the processing chamber 110. For example, the pumping the pumping plate 910 can include a continuous pumping channel 912 configured around the workpiece 114. The continuous pumping channel 912 can include an annular opening configured to allow gas to pass from a first side, such as a top side, of the workpiece 114 to a second side, such at the bottom side, of the workpiece. The continuous pumping channel 912 can be disposed concentrically around the guard ring 109. Additional pumping channels 913 can be disposed in the pumping plate 910 to facilitate gas movement within the processing chamber 110. A guard ring 109 can be used to lessen edge effects of radiation from one or more edges of the workpiece 114. The guard ring 109 can be position around the perimeter of the workpiece 114.

The pumping plate 910 can be or include a quartz material. Furthermore, in some embodiments, pumping plate 910 can be or include hydroxyl doped quartz. Hydroxyl doped quartz can exhibit desirable wavelength blocking properties in accordance with the present disclosure.

Figure 17:
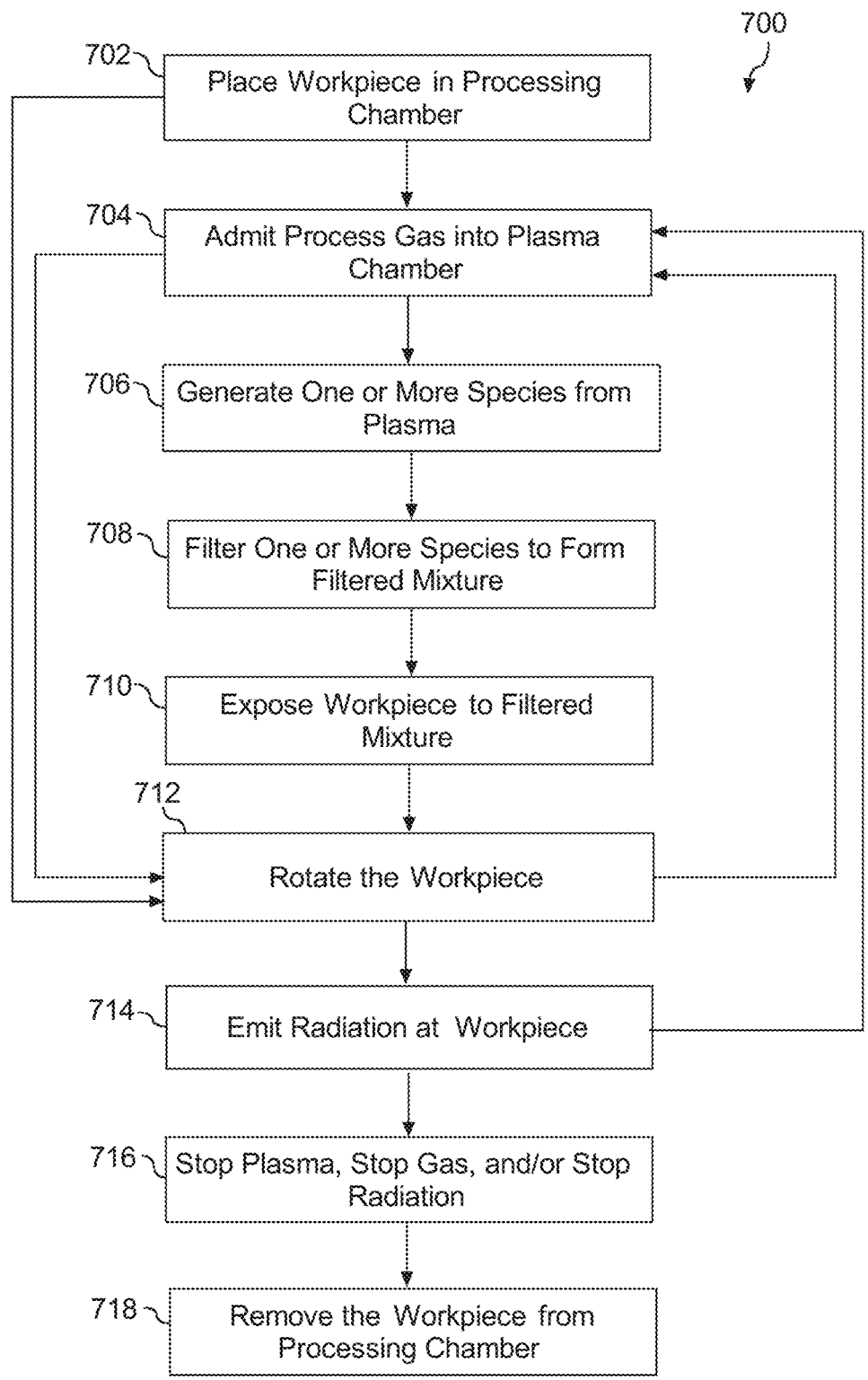
FIG. 17 depicts an example flowchart of a method according to example aspects of the present disclosure.

FIG. 17 depicts a flow diagram of one example method (700) according to example aspects of the present disclosure. The method (700) will be discussed with reference to the processing apparatus 100 of FIG. 1 by way of example. The method (700) can be implemented in any suitable plasma processing apparatus. FIG. 17 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (702), the method can include placing a workpiece 114 in a processing chamber 110 of a plasma processing apparatus 100. The processing chamber 110 can be separated from a plasma chamber 120 (e.g., separated by a separation grid assembly). For instance, the method can include placing a workpiece 114 onto workpiece support 112 in the processing chamber 110 of FIG. 1. The workpiece 114 can include one or more layers comprising silicon, silicon dioxide, silicon carbide, one or more metals, one or more dielectric materials, or combinations thereof.

At (704) the method includes admitting a process gas to the plasma chamber. For example, a process gas can be admitted to the plasma chamber 120 via the gas delivery system 155 including a gas distribution channel 151. The gas delivery system 155 can be used to deliver a process gas capable of etching at least one material layer from the workpiece 114. For example, the process gas can include oxygen-containing gases (e.g. $O_2$, $O_3$, $N_2O$), hydrogen-containing gases (e.g., $H_2$, $D_2$), nitrogen-containing gases (e.g. $N_2$, $NH_3$, $N_2O$), fluorine-containing gases (e.g. $CF_4$, $C_2F_4$, $CHF_3$, $CH_2F_2$, $CH_3F$, $SF_6$, $NF_3$), hydrocarbon-containing gases (e.g. $CH_4$), or combinations thereof. In some embodiments, the process gas can be mixed with an inert gas that can be called a "carrier" gas, such as He, Ar, Ne, Xe, or $N_2$. A control valve 158 can be used to control a flow rate of each feed gas line to flow a process gas into the plasma chamber 120. A gas flow controller 185 can be used to control the flow of process gas.

At (706) the method includes generating one or more species from the process gas using a plasma induced in the plasma chamber 120. For example, to generate one or more species or radicals, the induction coil 130 can be energized with RF power from the RF power generator 134, to generate a plasma from the process gas in the plasma chamber 120. The plasma generated can include one or more species including radicals. Suitable radicals can include etchant radicals capable of removing portions of material or material layer from a workpiece. Other radicals can be generated that can modify surface properties of the workpiece 114. For example, radicals can be generated that can selectively deposit material layers on portions of the workpiece. Radicals can be generated that are capable of modifying the chemical or material composition of material layers on the workpiece, including but not limited to surface cleaning, surface smoothing, materials oxidation, materials nitridation, materials doping, etc. Examples of suitable radicals include, hydrogen radicals, oxygen radicals, fluorine radicals, and combinations thereof. In some embodiments, the plasma generated in the plasma chamber is a remote plasma containing one or more radicals, such as hydrogen radicals, fluorine radicals, oxygen radicals, and combinations thereof.

At (708) the method includes filtering the one or more species to generate a filtered mixture. To create a filtered mixture the one or more species can be filtered via a separation grid 200 that separates the plasma chamber 120 from the processing chamber 110 to generate the desired radicals. The separation grid 200 can be used to perform ion filtering from a mixture generated by plasma in the plasma chamber 120 to generate a filtered mixture. The filtered mixture may contain one or more radicals.

In some embodiments, the separation grid 200 can be configured to filter ions with an efficiency greater than or equal to about 90%, such as greater than or equal to about 95%. A percentage efficiency for ion filtering refers to the amount of ions removed from the mixture relative to the total number of ions in the mixture. For instance, an efficiency of about 90% indicates that about 90% of the ions are removed during filtering. An efficiency of about 95% indicates that about 95% of the ions are removed during filtering.

In some embodiments, the separation grid can be a multi-plate separation grid. The multi-plate separation grid can have multiple separation grid plates in parallel. The arrangement and alignment of holes in the grid plate can be selected to provide a desired efficiency for ion filtering, such as greater than or equal to about 95%.

In some embodiments, one or more separation grid plates can include one or more cooling channels disposed therein. The method can include cooling the one or more separation grids by pumping fluid through one or more cooling channels.

Further, in some embodiments the method includes admitting a non-process gas through one or more gas injection ports at or below the separation grid to adjust energy of radicals passing through the separation grid.

At (710) the method includes exposing the workpiece to the filtered mixture. The filtered mixture can include one or more radicals capable of modifying a surface of the workpiece 114. For example, the filtered mixture can include one or more radicals capable of stripping material from the workpiece 114. In other embodiments, the filtered mixture can include one or more radicals capable of depositing material layers on the workpiece. In other embodiments, the filtered mixture can include one or more radicals capable of modifying the chemical composition or chemical or mechanical properties of one or more material layers on the surface of the workpiece.

Figure 8:
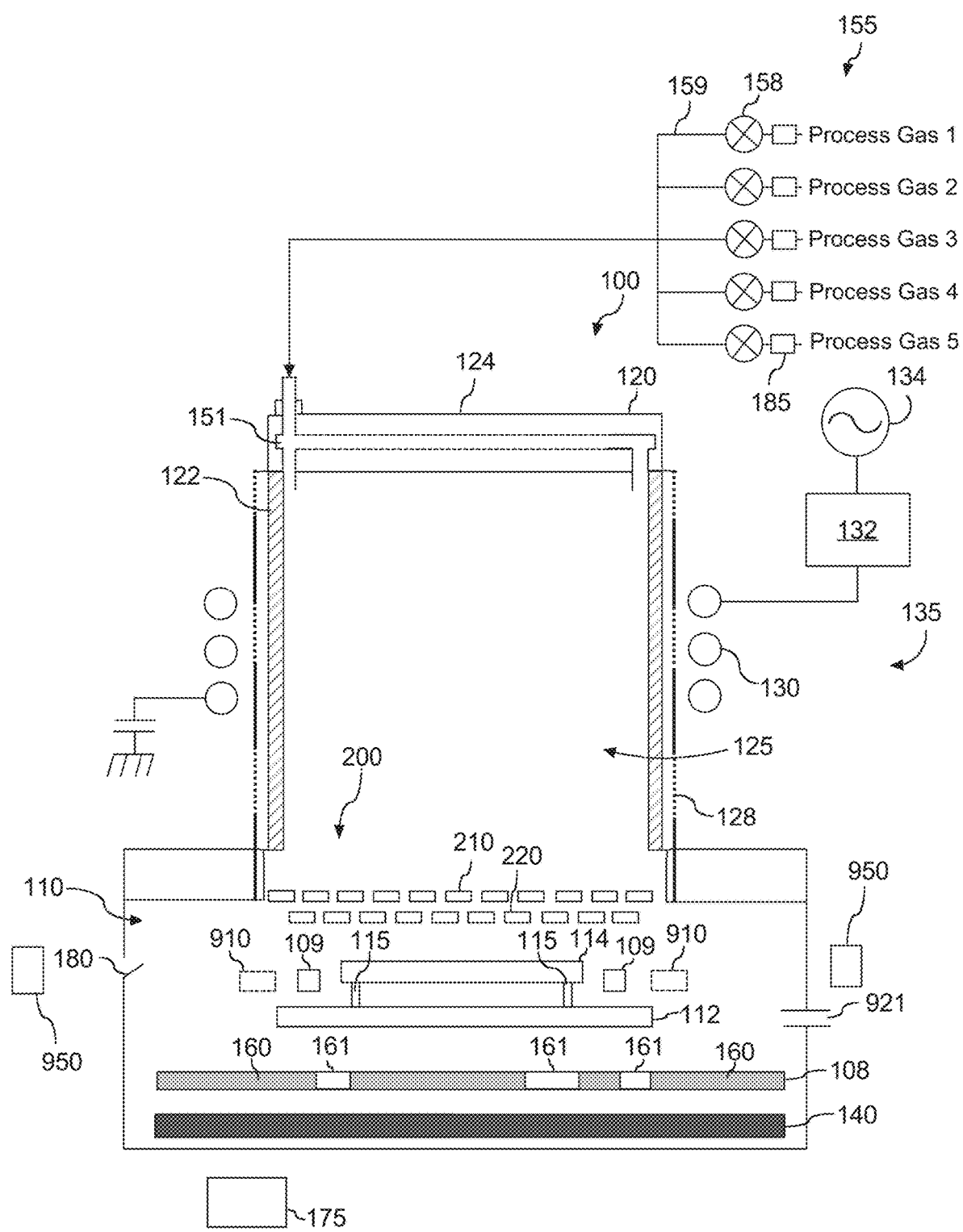
FIG. 8 depicts an example processing system according to example aspects of the present disclosure.
Figure 9:
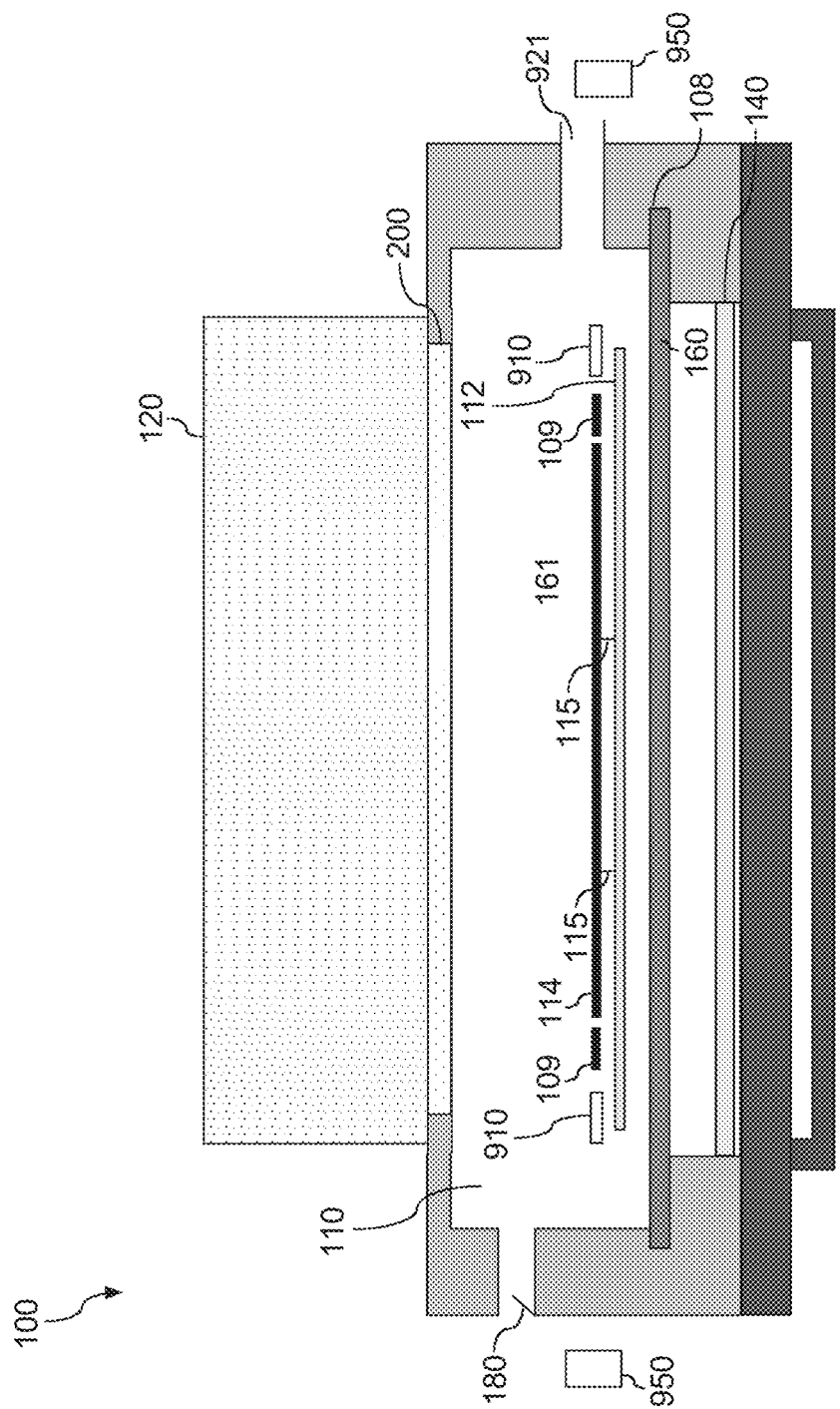
FIG. 9 depicts an example processing system according to example aspects of the present disclosure.

At (712) the method includes rotating the workpiece 114 in the processing chamber 110. For example, the workpiece 114 can be rotated in the processing chamber while radiation is emitted from heat source 140. As shown in FIG. 1, the rotation shaft 900 is coupled to the workpiece support 112 and is also coupled to a magnetic actuator 920. The magnetic actuator 920 can be used to rotate the rotation shaft 900 thereby rotating the workpiece support 112, and the workpiece 114 thereon. In other embodiments, the workpiece 114 can be rotated by a magnetic levitation device 950. For example, as shown in FIG. 8, the magnetic levitation device 950 can be magnetically coupled to the workpiece support 112, such that magnetic forces created by the magnetic levitation device 950 can rotate the workpiece support 112 and the workpiece 114 thereon in the processing chamber 110. In other embodiments, the magnetic levitation device 950 can be magnetically coupled to the workpiece 114, such that magnetic forces created by the magnetic levitation device 950 can lift the workpiece 114 from the workpiece support 112 and rotate the workpiece 114.

At (714) the method includes emitting radiation directed at one or more surfaces of the workpiece to heat the workpiece. For example, one or more heat sources 140 can include one or more heating lamps 141. For example, heat sources 140 including one or more heating lamps can emit electromagnetic radiation to heat workpiece 114. Example heat sources 140 as described herein can be used. In certain embodiments, directive elements, such as for example, reflectors (e.g., mirrors) can be configured to direct electromagnetic radiation from one or more heating lamps 141 towards a workpiece 114 and/or workpiece support 112.

Exposing the workpiece 114 to the filtered mixture, rotating the workpiece, and emitting radiation at the workpiece can be alternated until desired processing of the workpiece is achieved. In other embodiments, it may be desired to expose the workpiece 114 to the filtered mixture while simultaneously emitting radiation at the workpiece to heat the workpiece. Depending on process parameters, process gas can be removed from the processing chamber 110 via one or more gas exhaust ports 921.

Figure 10:
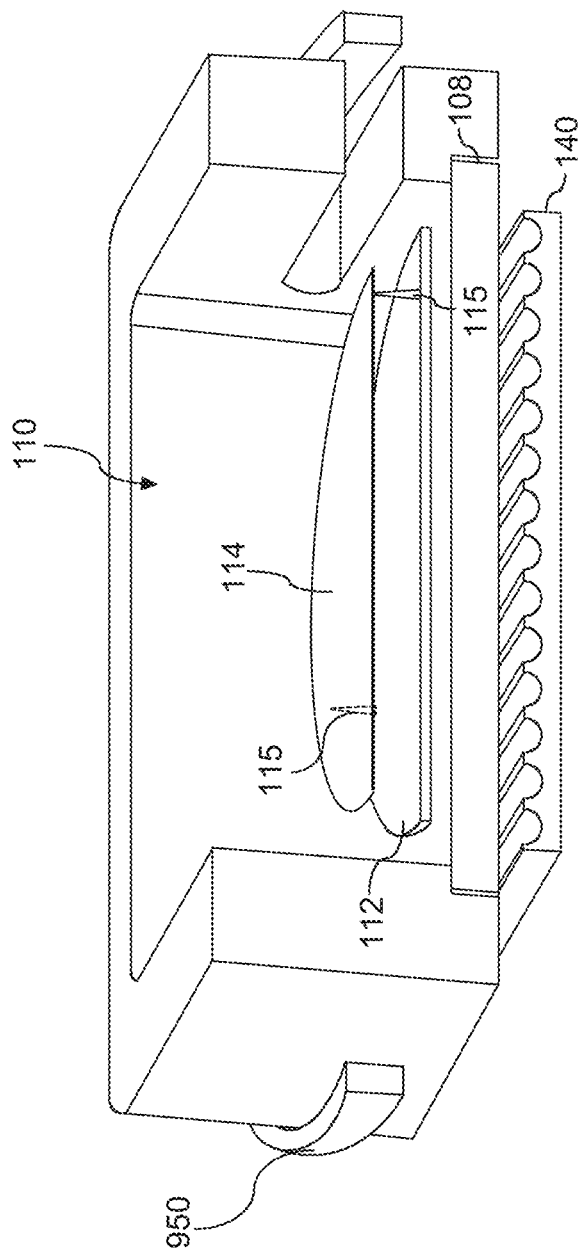
FIG. 10 depicts an example processing system according to example aspects of the present disclosure.
Figure 11:
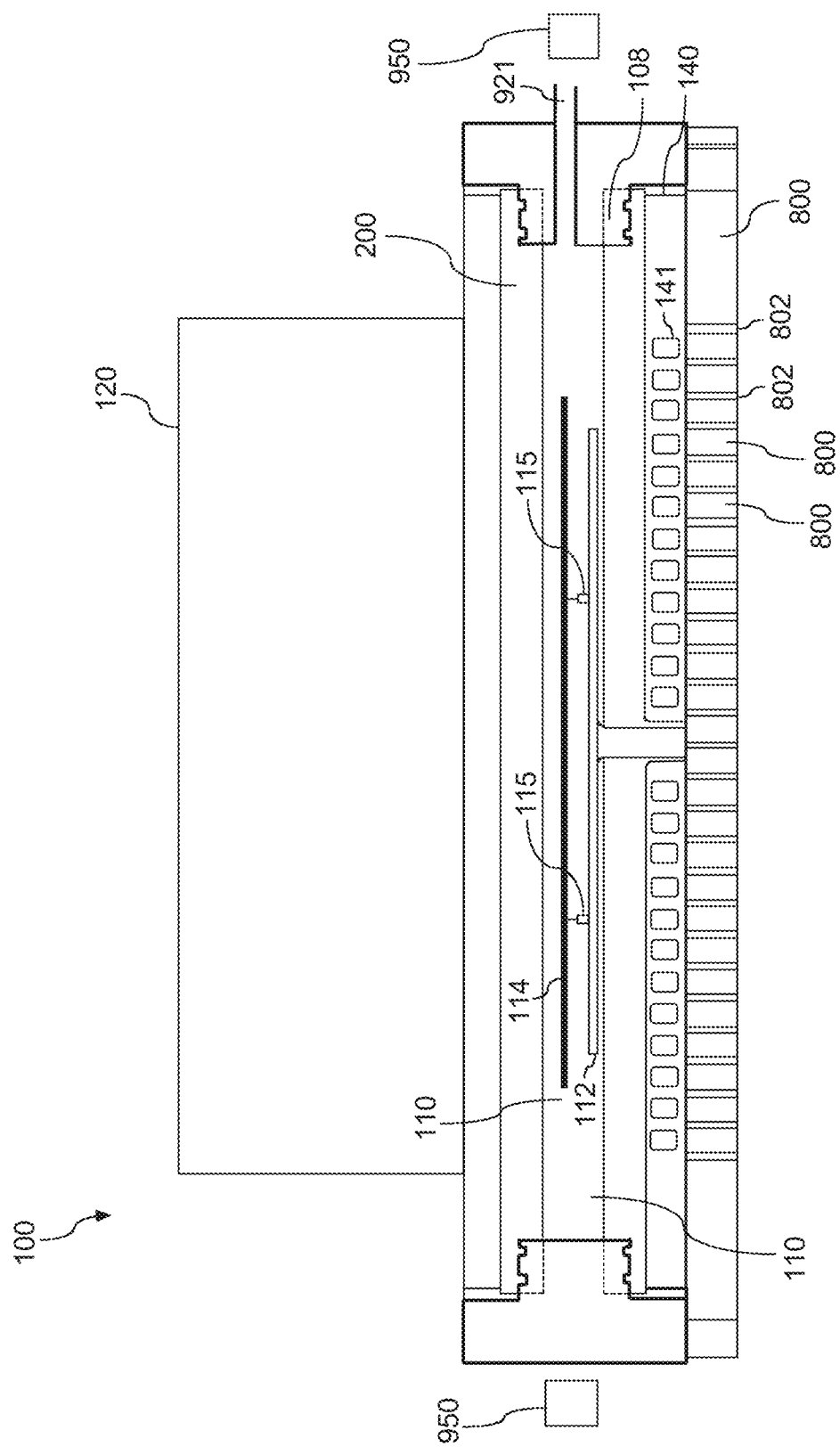
FIG. 11 depicts an example processing system according to example aspects of the present disclosure.

In some embodiments, as indicated by the various arrows in FIG. 10 the method can include the listed steps in a variety of orders or combinations. For example, in certain embodiments, the workpiece 114 may be placed in the processing chamber 110 and exposed to radiation before plasma treatment of the workpiece 114. Exposing the workpiece 114 to the filtered mixture, emitting radiation at the workpiece 114, and rotating the workpiece 114 can be alternated until desired processing of the workpiece 114 is achieved. In other embodiments, it may be desired to expose the workpiece 114 to the filtered mixture while simultaneously emitting radiation at the workpiece 114 to heat the workpiece. Indeed, for uniform workpiece 114 heating, the workpiece 114 can be rotated while being exposed to radiation. The steps provided herein can be alternated or repeated in any manner depending on the desired processing parameters.

In other embodiments, it is contemplated that the workpiece 114 can be placed in the processing chamber 110 and then the workpiece 114 can be exposed to radiation, for example to heat the workpiece 114 to a certain processing or pre-processing temperature. After the workpiece 114 achieves the pre-processing temperature the workpiece 114 can be exposed to the desired thermal treatment and/or plasma treatment.

At (716) plasma generation is stopped, gas flow into either the plasma chamber and/or the processing chamber is stopped, and radiation emittance is stopped, thus ending workpiece processing.

At (718) the method includes removing the workpiece from the processing chamber 110. For instance, the workpiece 114 can be removed from workpiece support 112 in the processing chamber 110. The plasma processing apparatus can then be conditioned for future processing of additional workpieces.

Further aspects of the invention are provided by the subject matter of the following clauses:

A method for processing a workpiece in a processing apparatus, the method comprising: placing the workpiece on a workpiece support disposed in a processing chamber; admitting one or more process gases to a plasma chamber; generating one or more species from the one or more process gases in a plasma using an inductively coupled plasma source in the plasma chamber; filtering the one or more species with one or more separation grids to create a filtered mixture containing one or more radicals; exposing the workpiece to the filtered mixture containing one or more radicals; emitting, by one or more radiative heat sources, radiation directed at one or more surfaces of a workpiece to heat at least a portion of a surface of the workpiece; and rotating the workpiece in the processing chamber via a rotation system including a magnetic actuator.

The method of any preceding clause, wherein the rotation system includes a rotation shaft coupled to the magnetic actuator, the rotation shaft at least partially disposed in the processing chamber.

The method of any preceding clause, wherein a first portion of the rotation shaft is disposed in the processing chamber and a second portion of the rotation shaft is disposed outside the processing chamber such that a vacuum pressure can be maintained in the processing chamber.

The method of any preceding clause, wherein the magnetic actuator is disposed at a fixed location in the processing chamber.

The method of any preceding clause, wherein the magnetic actuator comprises a magnetic levitation system capable of producing a magnetic field to rotate the workpiece.

The method of any preceding clause, further comprising maintaining a vacuum pressure in the processing chamber.

The method of any preceding clause, further comprising removing gas from the processing chamber using one or more exhaust ports.

The method of any preceding clause, further comprising disposing a pumping plate around the workpiece, the pumping plate providing one or more channels for the directing a flow of process gas through the processing chamber.

The method of any preceding clause, wherein the process gas comprise an oxygen-containing gas, a hydrogen-containing gas, a nitrogen-containing gas, a hydrocarbon-containing gas, a fluorine-containing gas, or combinations thereof.

The method of any preceding clause, comprising alternating exposing the workpiece to the filtered mixture containing one or more radicals and emitting, by one or heat sources, radiation directed at one or more surfaces of a workpiece to heat at least a portion of a surface of the workpiece.

The method of any preceding clause, comprising removing process gas from the processing chamber using one or more exhaust ports.

The method of any preceding clause, comprising cooling the one or more separation grids by pumping fluid through one or more cooling channels disposed in the one or more separation grids.

The method of any preceding clause, further comprising stopping plasma generation, the flow of process gas, or emitting radiation.

The method of any preceding clause, further comprising removing the workpiece from the processing chamber.

The method of any preceding clause, further comprising admitting a non-process gas through one or more gas injection ports at or below the separation grid to adjust energy of radicals passing through the separation grid.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A processing apparatus for processing a workpiece, the processing apparatus comprising:
   a processing chamber;
   a plasma chamber separated from the processing chamber, the plasma chamber disposed on a first side of the processing chamber;
   a gas supply system configured to deliver one or more process gases to the plasma chamber;
   a plasma source configured to generate a plasma from the one or more process gases in the plasma chamber;
   a workpiece support disposed within the processing chamber, the workpiece support configured to support a workpiece, wherein a back side of the workpiece faces the workpiece support;
   one or more radiative heat sources configured on a second and opposite side of the first side of the processing chamber, the radiative heating sources configured to heat the workpiece from the back side of the workpiece;
   a dielectric window disposed between the workpiece support and the one or more radiative heat sources; and
   a rotation system configured to rotate the workpiece, the rotation system comprising a magnetic actuator.

2. The processing apparatus of claim 1, wherein the rotation system comprises a rotation shaft passing through the dielectric window, the rotation shaft configured to rotate the workpiece support in the processing chamber, wherein the rotation shaft is coupled to the magnetic actuator.

3. The processing apparatus of claim 2, wherein a first portion of the rotation shaft is disposed in the processing chamber and a second portion of the rotation shaft is disposed outside the processing chamber such that a vacuum pressure can be maintained in the processing chamber.

4. The processing apparatus of claim 3, wherein the second portion of the rotation shaft is coupled to the magnetic actuator.

5. The processing apparatus of claim 1, wherein the magnetic actuator is disposed around the workpiece.

6. The processing apparatus of claim 5, wherein the magnetic actuator comprises a magnetic levitation system.

7. The processing apparatus of claim 6, wherein the magnetic levitation system can move the workpiece in a vertical direction.

8. The processing apparatus of claim 1, wherein the plasma source is an inductively-coupled plasma source.

9. The processing apparatus of claim 8, wherein a grounded Faraday shield is disposed between the inductively-coupled plasma source and the plasma chamber.

10. The processing apparatus of claim 1, wherein the plasma chamber and processing chamber are separated via one or more separation grids.

11. The processing apparatus of claim 10, wherein the one or more separation grids comprise one or more cooling channels disposed therein.

12. The processing apparatus of claim 11, wherein a fluid is pumped through the one or more cooling channels to cool the one or more separation grids.

13. The processing apparatus of claim 12, wherein the fluid comprises water.

14. The processing apparatus of claim 10, further comprising one or more gas injection ports configured to inject gas between one or more separation grids.

15. The processing apparatus of claim 10, wherein the one or more separation grids are disposed such that one or more process gases can pass through the one or more separation grids into the processing chamber and expose a topside of the workpiece to the one or more process gases.

16. The processing apparatus of claim 10, wherein the one or more separation grids are disposed such that the plasma can be filtered forming a filtered mixture in the processing chamber exposing a topside of the workpiece to the filtered mixture.

17. The processing apparatus of claim 1, wherein the dielectric window comprises quartz.

18. The processing apparatus of claim 1, further comprising a pumping plate disposed around the workpiece, the pumping plate comprising one or more channels for directing a flow of gas through the processing chamber.

19. The processing apparatus of claim 1, wherein the one or more radiative heating sources are configured to emit broadband radiation to heat the workpiece.

20. The processing apparatus of claim 1, wherein the processing chamber is configured to maintain a vacuum pressure.

* * * * *